United States Patent [19]

Voyles et al.

[11] 3,781,678

[45] Dec. 25, 1973

[54] AUTOMATIC TRANSFER OSCILLATOR WITH IMPROVED FM TOLERANCE

[75] Inventors: Richard E. Voyles, Moraga; William A. Giles, Concord, both of Calif.

[73] Assignee: Systron Donner Corporation, Concord, Calif.

[22] Filed: Feb. 14, 1973

[21] Appl. No.: 332,354

[52] U.S. Cl. .............................................. 324/79 D
[51] Int. Cl. .............................................. G01r 23/14
[58] Field of Search ........................ 324/78 D, 79 D; 325/455

[56] References Cited

UNITED STATES PATENTS 3,701,951 10/1972 Krausser ............................ 325/455

FOREIGN PATENTS OR APPLICATIONS 1,080,877 8/1967 Great Britain .................... 324/78 D

*Primary Examiner*—Alfred E. Smith
*Attorney*—Paul D. Flehr et al.

[57] ABSTRACT

An automatic transfer oscillator for counting a radio frequency input signal with improved FM tolerance includes a frequency locked loop in combination with a circuit for deriving the harmonic number of the frequency locked loop. A counting circuit counts both the local oscillator and intermediate frequency of the frequency locked loop concurrently over a common time period to provide the final RF count.

5 Claims, 4 Drawing Figures

AUTOMATIC TRANSFER OSCILLATOR WITH IMPROVED FM TOLERANCE

BACKGROUND OF THE INVENTION

The present invention is directed to an automatic transfer oscillator with improved FM tolerance and more particularly to a radio frequency (RF) counter.

Automatic transfer oscillators are useful for production line testing and a variety of requirements where wide band frequency measurements are necessary. Since the device automatically finds the harmonic number of the frequency being measured, virtually nothing is required of the operator except to read out the answer. However, such devices do not accept excessive FM signals. Thus, they are basically CW type measurement devices. One reason for the foregoing is the phase locking of the variable oscillator to the input frequency.

OBJECT AND SUMMARY OF THE INVENTION

It is, therefore, an object of the invention to provide an automatic transfer oscillator having improved tolerance to FM.

In accordance with the above object there is provided an automatic transfer oscillator for measuring the frequency of a radio frequency (RF) signal including a harmonic mixer. A voltage controlled oscillator (VC0) produces a local oscillator (L.O.) signal. A negative feedback loop includes the harmonic mixer coupled to and responsive to the L.O. signal of the VCO and responsive to the RF sigal to produce an intermediate frequency (IF) signal. The loop also includes a discriminator coupled to the harmonic mixer and responsive to the IF signal for producing a d.c. voltage having an amplitude and polarity determined by any IF signal frequency changes. This d.c. voltage drives the VCO. Circuit means are coupled to the VCO and responsive to the L.O. signal and the RF signal for finding the harmonic number, N, at which the harmonic mixer is operating and provides a harmonic number output signal proportional to the harmonic number. Counting means are responsive to the harmonic number output signal and a predetermined time base for concurrently counting the frequencies of the L.O. and IF signals over a common time period. This time period is determined by the harmonic number output signal and time base. The sum of the counts is indicative of the frequency of the RF signal.

DETAILED DESCRIPTION OF THE PREFERRED EMBODIMENT

Figure 1:
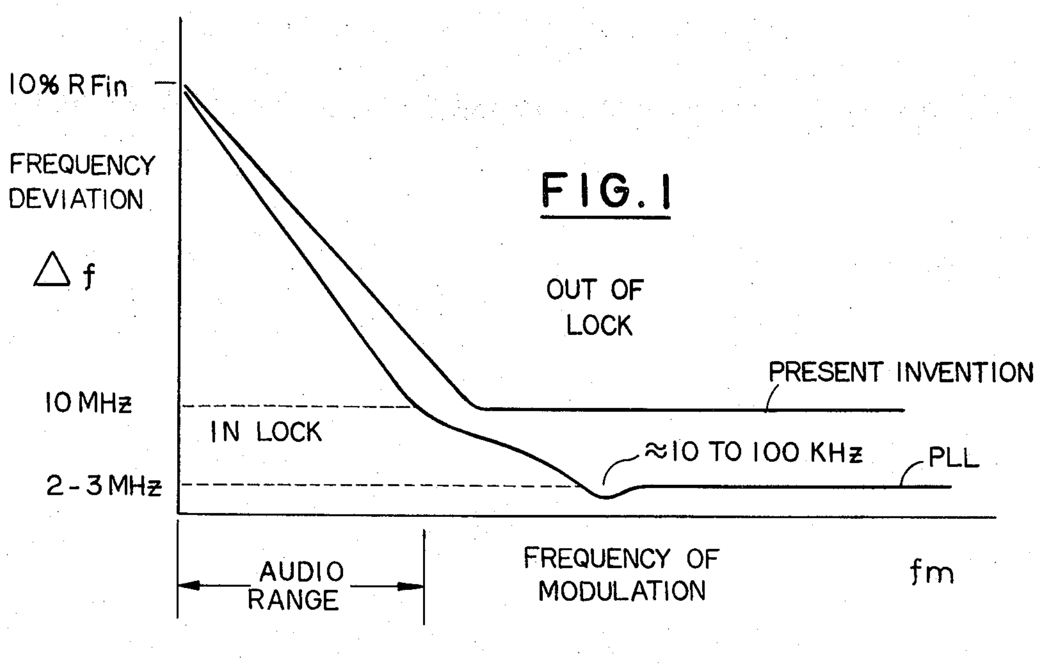
FIG. 1 shows characteristic curves comparing the present invention to the prior art.

As discussed in conjunction with the prior art, the typical automatic transfer oscillator includes a phase locked loop (PLL) to cause the voltage controlled oscillator to lock onto the input signal. As illustrated in FIG. 1, the use of such PLL limits the frequency modulation (FM) tolerance of the mesuring device. As indicated by the curve labeled PLL the area below the curve is an in-lock condition and above an out-of-lock condition. Thus, at higher frequencies of modulation, fm, such devices cannot accommodate frequency deviations greater than 2 to 3 megahertz, for example. Moreover, there is a critical point at the 10 to 100 kilohertz frequency of modulation where a dip occurs in the curve. In contrast in the present invention, the curve is so labeled, the accommodation to frequency deviation is much greater; for example, of the 10 megahertz range.

Figure 2:
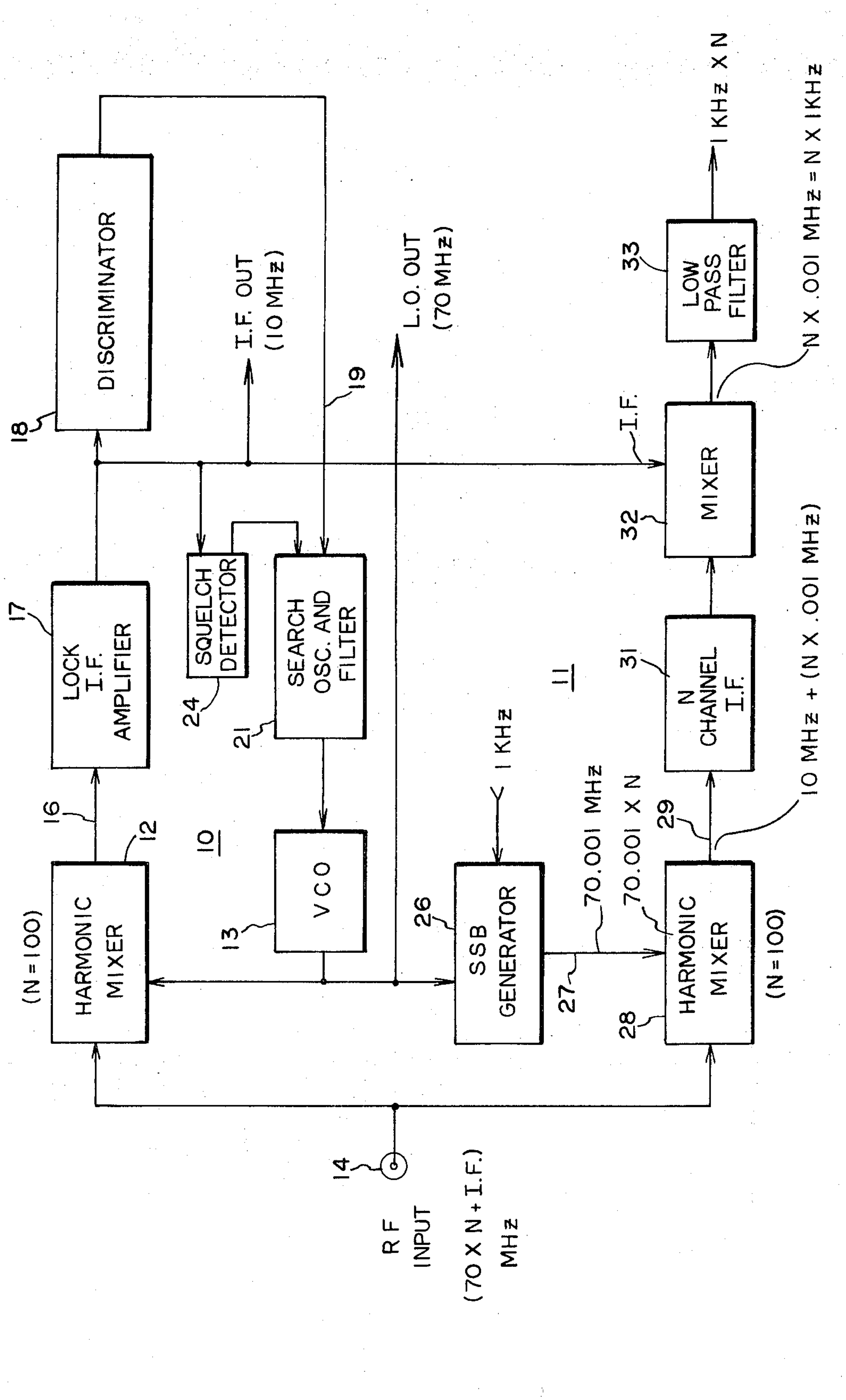
FIG. 2 is a block diagram of a portion of a circuit embodying the present invention.

FIG. 2 illustrates a portion of the automatic transfer oscillator of the present invention which includes a negative feedback loop portion 10 which is essentially a transfer oscillator in the upper portion of FIG. 2 and a circuit 11 in the lower portion of FIG. 2 which derives the harmonic number of the frequency being measured. The numerical values indicated on the drawing are typical and for purposes of explanation only.

First referring to the negative feedback loop portion 10, it includes a harmonic mixer 12 for generating any of several harmonics of a local oscillator signal from voltage controlled oscillator (VCO) 13. The RF input terminal 14 is coupled to the RF signal frequency which is to be measured. Harmonic mixer 12 and its output line 16 produces an intermediate frequency (IF) signal which is the difference between the local oscillator signal from VCO 13 which has been multiplied by the harmonic number, N, which in the present example is equal to 100, and the RF input signal. Thus, where the local oscillator signal is, for example, 70 megahertz, this would indicate an RF input of (70 × + IF) megahertz. The lock IF amplifier 17 provides amplification and proper bandwidth for the IF channel which in the present case has a 10 megahertz center frequency. A discriminator 18 is coupled to the output of IF amplifier 17 and is responsive to such output to produce a d.c. voltage on line 19 which has an amplitude and polarity determined by frequency changes in the IF signal. This d.c. voltage on line 19 drives VCO 13 through search oscillator and filter 21. As is well known in the automatic transfer oscillator art such search oscillator is initially used to sweep the VCO 13 until the selected IF frequency signal is reached whereupon the search oscillator is overridden. VCO 13 is then tuned to an exact sub-multiple of the RF input frequency signal with the IF offset.

Figure 3:
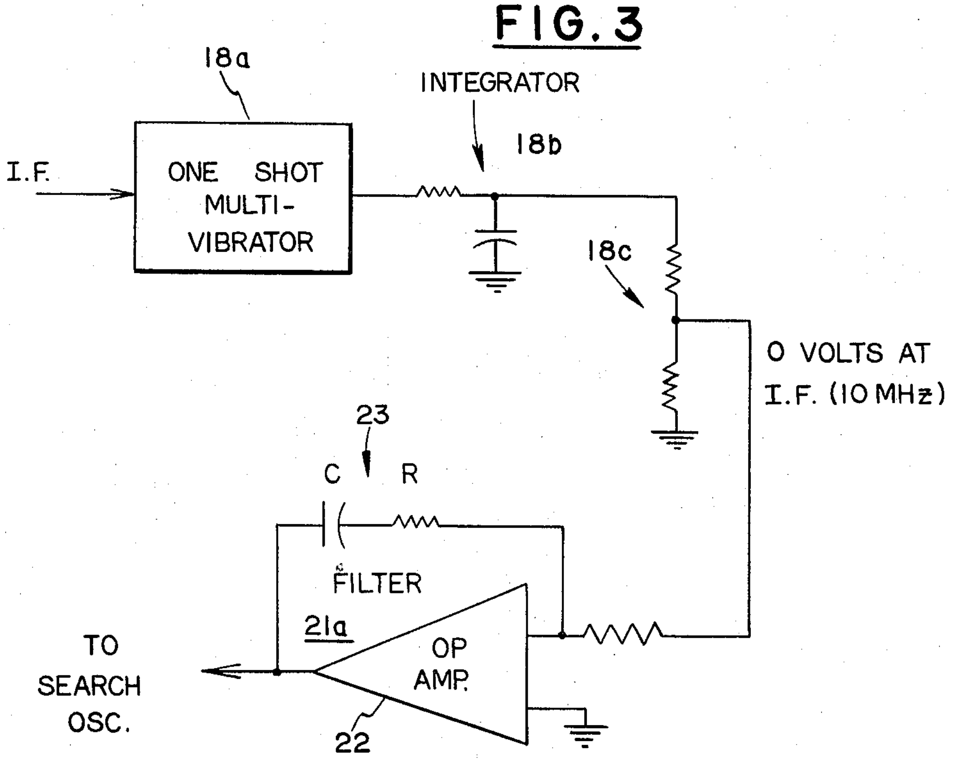
FIG. 3 is a more detailed circuit schematic of a portion of FIG. 2.

Referring briefly to FIG. 3 the discriminator 18 includes a one shot multivibrator **18*a* for generating a pulse train which is representative of the IF frequency and its changes. The output of the one shot multivibrator is coupled to an integrator 18*b*, which is a typical RC network, which integrates the pulse train for producing a slowly varying d.c. voltage in response to changes in the IF frequency. Such slowly varying d.c. voltage is coupled to the voltage divider 18*c* which is adjusted so that at a zero volts output, an IF frequency of, for example, 10 megahertz is produced by the action of VCO 13. The output of divider 18*c* is coupled to the filter 21*a* which is a portion of search oscillator and filter 21 of FIG. 2. The purpose of filter 21, which is of a typical active amplifier type including operational amplifier 22 and RC feedback network 23, is for reducing the gain of the negative feedback loop 10 for higher frequencies to prevent an unstable condition. The output of filter 21*a*** is then coupled to the search oscillator during the search mode or directly to VCO 13.

Referring again to FIG. 2 squelch detector 24 is coupled to the IF out line to prevent generation of both upper and lower combinations of the multiplied local oscillator frequency and the RF input.

As thus far described the negative feedback loop 10 is a type of frequency lock loop. The L.O. output multiplied by the harmonic number, N, and added to the IF output provides the RF input frequency. However, the harmonic number, N, must first be determined.

Referring now to circuit portion 11 N is found by driving a single side band generator 26 with the local oscillator output of VCO 13. This generator is modulated at a 1 kHz rate, the resultant output being equal to the local oscillator frequency shifted in frequency by 1 kHz on line 27 as indicated; that is, with the typical example the frequency would be 70.001 MHz. The shifted frequency is then coupled to the harmonic mixer 28 which is also coupled to the RF input 14. The output of harmonic mixer 28 on line 29 will not be the 10 MHz lock IF frequency of the loop 10 since the signal driving the mixer is 1 kHz different from the output frequency of VCO 13. Thus, the actual output frequency is the IF frequency or 10 MHz plus 1 kHz times the harmonic number, N. Such channel IF frequency is processed by the amplifier 31 and coupled to a mixer 32. Mixer 32 is coupled to the IF frequency of loop 10 whereupon the diffemence frequency is the harmonic number, N, times 1 kHz. This is filtered by low pass filter 33. Since the original 1 kHz modulation frequency for the single sideband generator 26 is present it is thus possible to digitally extract the harmonic number N by comparing these two frequencies.

The foregoing technique for derivation of a signal representing the harmonic number is generally well known in the art. However, the mixer 32 is normally supplied with an externally generated IF signal rather than one which is generated by the loop 10. With the specific IF connection of the present invention variations in the IF will not affect the accuracy of the harmonic number output signal. In prior art automatic transfer oscillators where a stable independent IF source is utilized jitter may occur when the IF frequency varies. But as discussed above, in the prior art transfer oscillators such variation was minimized by use of a phase locked loop in place of the loop 10 as illustrated in the present invention. Again such a phase locked loop has the disadvantages as illustrated in FIG. 1 of being less tolerant to FM on the RF input signal. From a conceptual standpoint, the loop 10 of the present invention in effect averages out rapid fluctuations in any FM on the RF input signal; in other words, the loop 10 provides a spring like frequency lock rather than an absolute phase lock. Thus, the loop 10 does not have to track rapid fluctuations. 1

Referring

Since the IF signal of the present invention in loop 10 varies in accordance with the amount of FM which is present on the RF input signal, such IF output must be averaged out over a time interval. More importantly, however, since the local oscillator output signal of VCO 13 is used in computing the RF input signal such local oscillator signal must be counted over the same period of time and which is concurrent with the time period over which the IF signal is averaged out. This is accomplished in the counting circuit of FIG. 4 which receives the various outputs of the circuit of FIG. 2 as indicated including IF out, L.O. out and the kHz times N harmonic number signal. to FIG. 4, the IF signal has its frequency counted by an up/down counter 36 over a time period determined by a preselected time base times the harmonic number, N, or TB × N. This is accomplished by an AND gate 37 which has as one input the IF signal and as the other input a rectangular waveform designated as TB times N. Since this in effect multiplies the IF signal by the harmonic number, N, a divider 38 divides the output of AND gate 37 to provide the actual IF signal.

At the same time the up/down counter 36 is counting up in response to the IF input signal over the time period, TB × N, an accumulator 39 is counting the local oscillator signal for the same time period by means of an AND gate 41 whose output is coupled to accumulator 39 and which has the time period input TB × N.

The common time period is generated in the following manner. First, the harmonic number, N, is derived and stored in the N accumulator 42 by means of the AND gate 43 which is driven by the harmonic number output signal 1 kHz × N and by a gating signal which is the reciprocal of 1 kHz. The output of N accumulator 42 is coupled to a divider 38 which divides the IF signal and a divider 44 which divides a selected time base frequency $f_{TB}$ to provide the pulse train 46 as indicated which has a time between pulses of TB × N. A flip-flop circuit 47 then provides a pulse 48 representing the common time period or TB × N which is coupled to the input of AND gates 41 and 37 as discussed above. The selected time base frequency is dependent on the desired resolution of the frequency measurement.

The contents of the up/down counter 36 are added to accumulator 39 to provide the final RF count in the following manner. A flip-flop 49 is responsive to the trailing edge of the time period pulse 48 indicated by the letter A to produce an output on line 51 of the AND gate 52 to cause the counter 36 to start counting down. Gate 42 is also coupled to a constant frequency source $f_k$ of, for example, 10 MHz. Output 51 of AND gate 52 is also coupled to an AND gate 53 whose output is connected to accumulator 39. Thus, as counter 36 is counted down its contents are in effect added to accumulator 39. When the up/down counter 36 reaches zero, a zero detector line through an inverter 54 and AND gate 53 actuates flip-flop 49 to reset the flip-flop and stop the count down as indicated by letter B on output pulse 50 of flip-flop 49. At the same time it provides a READ output to indicate that the accumulator 39 now contains the summation of the IF frequency plus the local oscillator frequency multiplied by N which corresponds to the desired RF frequency.

Figure 4:
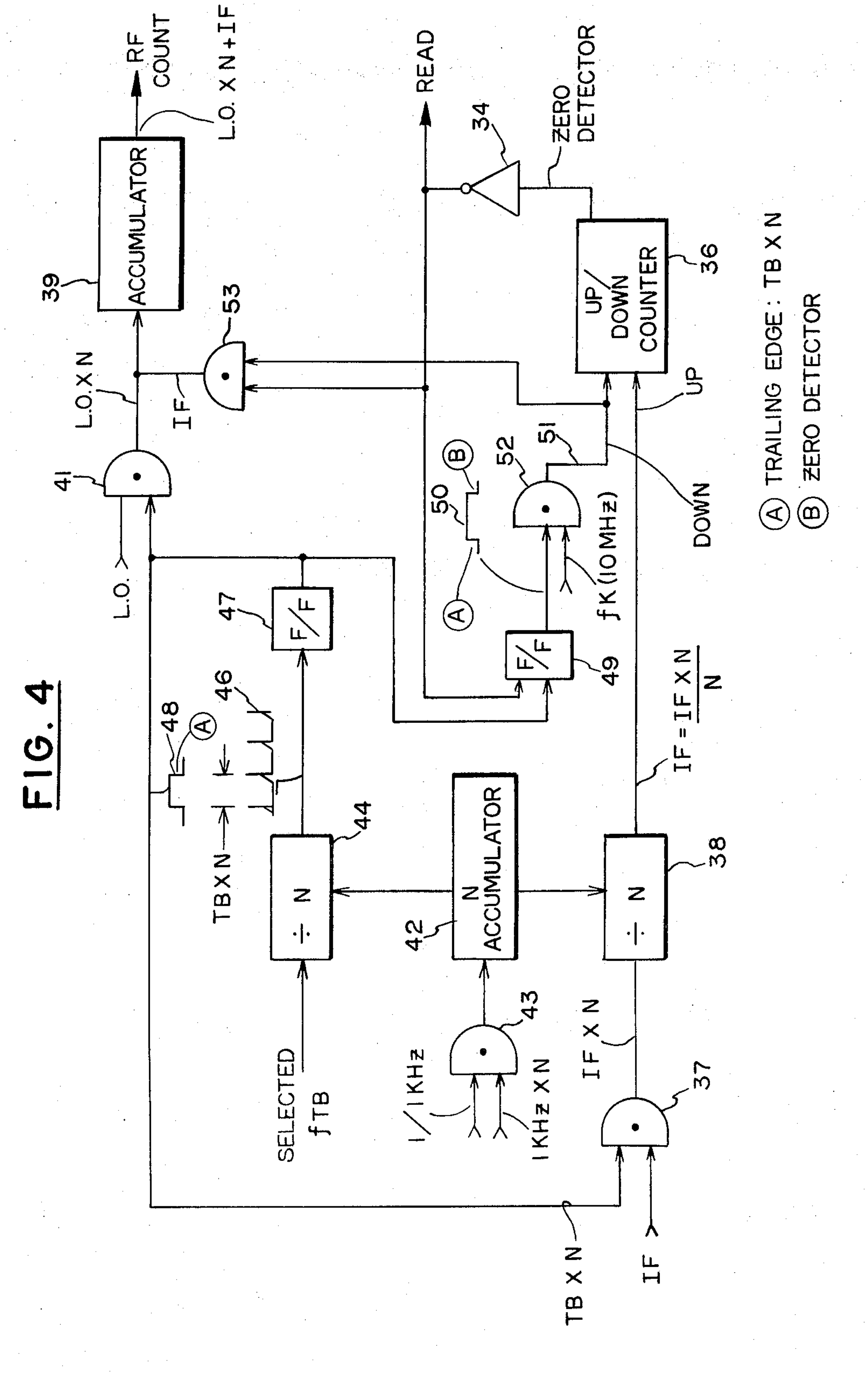
FIG. 4 is a block diagram related to FIG. 2 of the remaining circuit portion embodying the invention.

Thus, the circuit of the present invention as illustrated in FIGS. 2 and 4 provides an improved automatic transfer oscillator which has improved tolerance to FM on its RF input signal which it is measuring.

We claim:

1. An automatic transfer oscillator for measuring the frequency of a radio frequency (RF) signal comprising: a harmonic mixer; a voltage controlled oscillator (VCO) for producing a local oscillator (L.O.) signal; a negative feedback loop including said harmonic mixer coupled to and responsive to the L.O. signal of said VCO and responsive to said RF signal to produce an intermediate frequency (IF) signal, said loop including a discriminator coupled to said harmonic mixer and responsive to said IF signal for producing a d.c. voltage having an amplitude and polarity determined by any IF signal frequency changes said d.c. voltage driving said VCO; circuit means coupled to said VCO and responsive to said L.O. signal and said RF signal for finding the harmonic number, N, at which said harmonic mixer is operating and providing a harmonic number output signal proportional to said harmonic number; counting means responsive to said harmonic number output signal and a predetermined time base for concurrently counting the frequencies of said L.O. and IF signals over a common time period determined by said harmonic number output signal and said time base, the sum of said counts being indicative of the frequency of said RF signal.

2. An oscillator as in claim 1 where said counting means includes means for dividing said IF count by N and means for adding such divided count to said L.O. count.

3. An oscillator as in claim 1 where said counting means includes means for dividing said IF count by N, includes an up/down counter for receiving said divided IF count, an accumulator for storing said L.O. count, and includes means responsive to the end of said common time period for counting down said up/down counter and adding such IF count to said accumulator whereby said accumulator sums said L.O. and IF counts.

4. An oscillator as in claim 1 where said circuit means for finding N includes a mixer responsive to said IF signal whereby variations in said IF do not affect the accuracy of said harmonic number output signal.

5. An oscillator as in claim 1 where said discriminator includes a pulse generator for generating a pulse train representative of said IF frequency and includes an integrator for integrating said pulse train for producing a slowly varying d.c. voltage in response to changes in said IF frequency for driving said VCO.

* * * * *